United States Patent
Taira et al.

(10) Patent No.: US 7,477,878 B2
(45) Date of Patent: *Jan. 13, 2009

(54) DATA TRANSMISSION SYSTEM, DATA TRANSMITTER AND DATA RECEIVER USED IN THE DATA TRANSMISSION SYSTEM

(75) Inventors: Akinori Taira, Tokyo (JP); Fumio Ishizu, Tokyo (JP); Keishi Murakami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 370 days.

This patent is subject to a terminal disclaimer.

(21) Appl. No.: 10/743,738

(22) Filed: Dec. 24, 2003

(65) Prior Publication Data

US 2004/0137933 A1      Jul. 15, 2004

Related U.S. Application Data

(63) Continuation of application No. 09/097,677, filed on Jun. 16, 1998, now Pat. No. 6,731,910.

(30) Foreign Application Priority Data

Jun. 19, 1997     (JP) .................................. 9-162411

(51) Int. Cl.
*H04B 1/00* (2006.01)
*H04Q 7/20* (2006.01)

(52) U.S. Cl. .................. 455/69; 455/226.2; 455/245.1; 455/522; 370/318; 370/321; 375/345

(58) Field of Classification Search .................... 455/69, 455/70, 522, 226.2, 245.1, 277.1, 277.2, 455/436, 437; 370/318, 332–333, 252, 321, 370/515; 375/345, 367, 347
See application file for complete search history.

(56) References Cited

U.S. PATENT DOCUMENTS 4,004,226 A     1/1977   Qureshi et al.
5,204,976 A *   4/1993   Baldwin et al. .......... 455/234.2

(Continued)

FOREIGN PATENT DOCUMENTS

DE          41 38 798 A1      5/1993

(Continued)

OTHER PUBLICATIONS

TIA/EIA/IS-139.1-A (TIA/EIA Interim Standard: TDMA Cellular/PCS-Radio Interface-Mobile Station -base Station -Compatibility-Digital Control Channel).

(Continued)

*Primary Examiner*—Lee Nguyen
(74) *Attorney, Agent, or Firm*—Birch, Stewart, Kolasch & Birch, LLP

(57) ABSTRACT

In a data transmission system, a transmitter adds control data to transmission data, and modulates the resultant signal by a predetermined modulation method, and sends the result in a wireless manner. A receiver detects a reception power intensity by use of the control data contained in the transmitted signal. A random pattern is used for a reception-power detecting portion for detecting a reception power intensity, which is contained in the control data.

6 Claims, 9 Drawing Sheets

U.S. PATENT DOCUMENTS

| | | | |
|---|---|---|---|
| 5,644,590 A | 7/1997 | Sugita | |
| 5,774,814 A | 6/1998 | Haas | |
| 5,896,368 A | 4/1999 | Dahlman et al. | |
| 5,978,428 A | 11/1999 | Hayashi | |
| 6,018,651 A | 1/2000 | Bruckert et al. | |
| 6,163,533 A * | 12/2000 | Esmailzadeh et al. | 370/342 |

FOREIGN PATENT DOCUMENTS

| | | |
|---|---|---|
| DE | 4138798 | 5/1993 |
| EP | 0 440 239 A2 | 8/1991 |
| EP | 4400239 | 8/1991 |
| EP | 0 624 994 A1 | 11/1994 |
| EP | 0 624 994 A1 | 11/1994 |
| EP | 0 674 402 A1 | 8/1995 |
| EP | 0 674 402 A1 | 9/1995 |
| EP | 0674402 | 9/1995 |
| GB | 2 294 610 A | 5/1996 |
| JP | 61-58334 | 3/1986 |
| JP | 6447134 | 2/1989 |
| JP | 3230607 | 10/1991 |
| JP | 05-037407 | 2/1993 |
| JP | 06-204925 | 7/1994 |
| JP | 8-298682 | 11/1996 |
| JP | 08-298682 | 11/1996 |
| JP | 8298682 | 11/1996 |
| JP | 9-149003 | 6/1997 |
| JP | 09-252273 | 9/1997 |
| WO | 9602984 | 2/1996 |
| WO | WO/96/02984 | 2/1996 |
| WO | WO-96/02984 A1 | 2/1996 |

OTHER PUBLICATIONS

Research & Development Center for Radio Systems (pp. 22-26).

Liu, et al., "Quadilivel Periodic Sequences for Fast Start-Up Equalization and Channel Estimation" IEEE Transactions on Communications 44 (1996) Feb., No. 2, New Your US.

"Quadrilevel Periodic Sequences for Fast Start-Up Equalization and Channel Estimation" Ging-Shing Liu, et al, IEEE Transactions on Communications, IEEE Inc. New York, vol. 44, No. 2, Feb. 1, 1996, pp. 143-144.

* cited by examiner

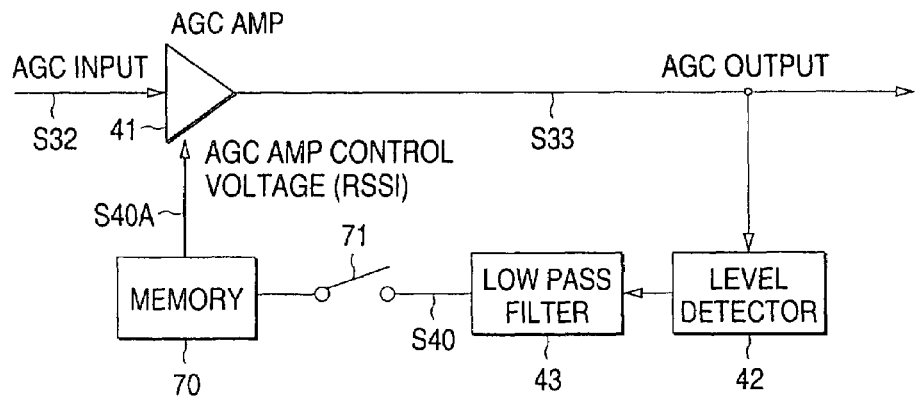
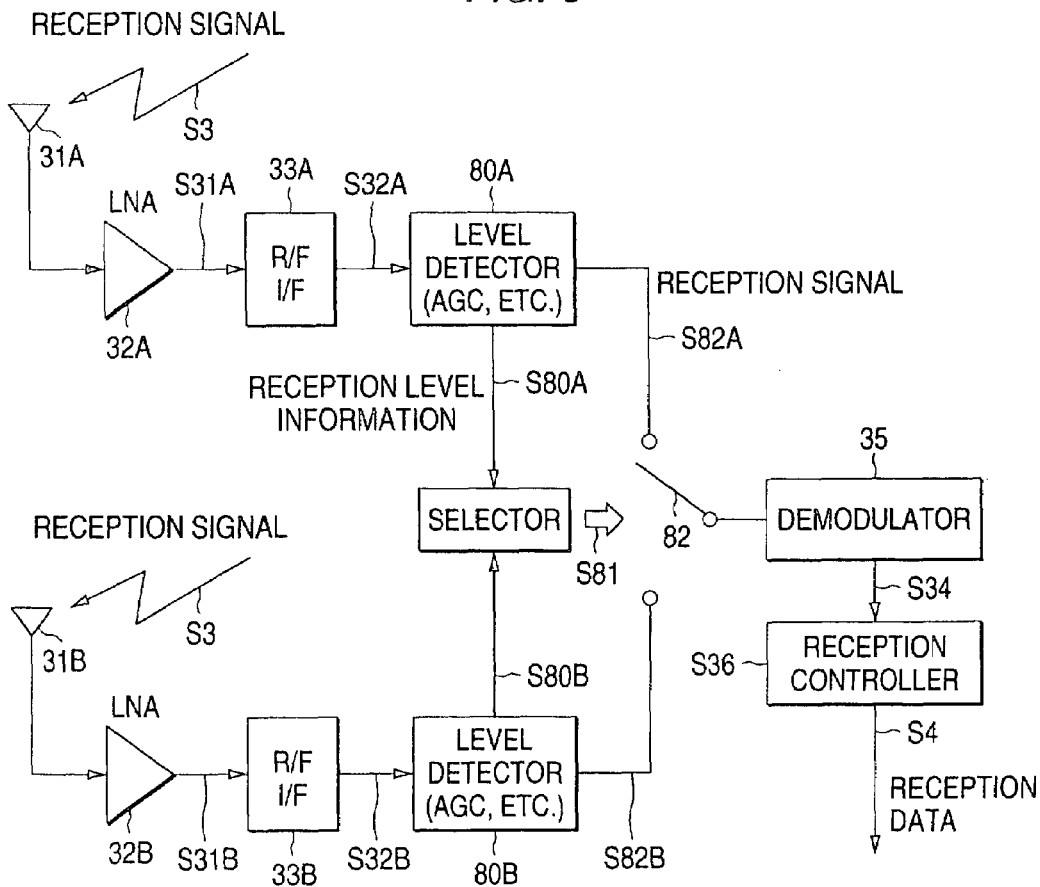

G: GUARD TIME

MIDAMBLE

G: GUARD TIME

US 7,477,878 B2

DATA TRANSMISSION SYSTEM, DATA TRANSMITTER AND DATA RECEIVER USED IN THE DATA TRANSMISSION SYSTEM

This application is a Continuation of application Ser. No. 09/097,677, filed on Jun. 16, 1998, now U.S. Pat. No. 6,731,910 the entire contents of which are hereby incorporated by reference and for which priority is claimed under 35 U.S.C. § 120; and this application claims priority of Application No. 9-162411 filed in Japan on Jun. 19, 1997 under 35 U.S.C. § 119.

BACKGROUND OF THE INVENTION

1. Field of the Invention

The present invention relates to a data transmission system as a communication system for a mobile communication and a mobile satellite communication, and a data transmitter and a data receiver which are used in the data transmission system.

2. Discussion of the Prior Art

In a mobile communication, a receiving signal level is greatly varied (in several tens dB or greater) since when propagating, it is subjected to various interferences, e.g., shadowing, fading and the like. One of the measures possibly taken for this problem is to correct the receiving signal level by the utilization of the AGC (automatic gain control). FIG. 8 shows in block form an overall wireless communication system. FIGS. 9 and 10 show also in block form a prior transmitter and a prior receiver in the mobile wireless communication system, which are prescribed in "TIA/EIA/IS-139.1-A" (TIA/EIA INTERIM STANDARD: TDMA Cellular/PCS-Radio Interface-Mobile Station-Base Station-Compatibility-Digital Control Channel) or "RCR STD-32".

In FIG. 8 showing the communication system, reference numeral 1 is a transmitter for converting a transmission data signal S1 into a radio signal which is to be transmitted in the form of a transmission signal S2; 2 is a channel for transmitting the wireless signal; and 3 is a receiver for extracting reception data S4 from a reception signal S3. In FIG. 9 showing the transmitter, numeral 11 is a burst generator; 12 is a preamble adder; 13 is a modulator; and 14 is an antenna. The preamble adder 12 generates a transmission burst signal S12 by use of the transmission data S1, an information signal S11 output from the preamble adder 12, and the like. A pattern of the preamble is a repetition pattern, e.g., ALL0. The modulator 13 modulates the transmission burst signal S12 and produces a modulated signal S13. The antenna 14 emits a radio wave containing the modulated signal S13. In FIG. 10 showing the receiver, numeral 31 is an antenna; 32 is a low noise amplifier (LNA); 33 is an RF/IF portion for frequency converting a signal S31 output from the low noise amplifier 32; 34 is an AGC portion for automatically controlling a low-frequency signal S32 output from the RF/IF portion 33 so that its output signal level has a fixed value; 35 is a demodulator for demodulating an AGC output signal S33; and 36 is a reception controller for extracting the reception data S4 from a demodulated signal S34 output from the demodulator 35. The wireless communication system thus arranged employs a repetition pattern, e.g., ALL0, for the preamble pattern.

Description will be given about the operation of the thus arranged mobile wireless communication system when it sends a signal from a mobile station MS to a base station BMI. The wireless communication system used here is prescribed in "TIA/EIA/IS-139.1-A". In the mobile station MS, the burst generator 11 constructs a transmission burst by adding the bits of a ramp (R), sync words (SYNC=synchronization, SYNC+=additional synchronization), and an AGC preamble (PREAM=preamble), to data (DATA, already error-correction coded) to be transmitted. A format of the transmission burst is shown in FIG. 11. In the "TIA/EIA/IS-139.1-A", the preamble consisting of eight symbols of the π/4 shift modulated as a repetition of "1" and "0" is added as the preamble pattern to the transmission data.

Those symbols of the preamble are phased as shown in FIG. 12. As shown, the preamble portion takes a fixed envelope level. The output signal S12 of the burst generator 11 is modulated by the modulator 13 and amplified, and then the thus processed signal is radiated from the antenna 14. When propagating through the channel 2, the radio signal is greatly affected by fadings (e.g., Rayleigh fading and frequency-selective fading), and its waveform is greatly distorted. Further, the signal level of the radio signal largely varies depending on the distance between the base station BMI and the mobile station MS, shadowing, and fadings. In the base station BMI, the radio signal S3 thus distorted in waveform and varied in amplitude is received by the antenna 31; it is amplified by the LNA 32; and it is converted into a low frequency signal by the RF/IF portion 33. An A/D converter and the like are provided at the input of the demodulator 35. Therefore, the input signal level must fall within a predetermined range of levels. An output signal of the RF/IF portion 33 has a great level variation. The level variation of the output signal must be removed before it is input to the demodulator 35. To remove the level variation, the AGC portion 34 is used. An output signal S34 of the AGC portion 34 is demodulated by the demodulator 35, and applied to the reception controller 36. The reception controller 36 extracts the data portion from the burst signal. The demodulated signal S34 is processed for its error removal, for example, and finally is output as a reception data signal S4.

The operation of the AGC portion 34 for effecting the level correction will be described. FIG. 13 shows a basic arrangement of the conventional AGC portion 34. In the figure, reference numeral 41 is an AGC amplifier; 42 is a level detector; and 43 is a low-pass filter (LPF). A low-frequency signal S32 input to the AGC portion 34 contains a great level variation, as mentioned above. The AGC amplifier 41 of the AGC portion 34 amplifies or attenuate the low-frequency signal S32, and produces an output signal S33. The AGC output signal S33 is input to the level detector 42. The level detector compares a signal level of the AGC output S33 with a reference signal level, and produces a signal representative of a difference between those signal levels. The difference signal is input to the LPF 43. The LPF removes a minute variation of the difference signal and outputs an AGC amplifier control voltage signal or an RSSI (received signal strength indicator) signal S40. The RSSI signal S40 determines a gain of the AGC amplifier 41. The AGC amplifier 41 is thus controlled, and through its control, the output signal strength level of the amplifier 41 is approximate to the reference signal level. The operation of the AGC portion 34 is as described above. A given time is taken till a close loop consisting of the AGC amplifier 41, level detector 42 and LPF 43 settles down in operation. In the "TIA/EIA/IS-139.1-A", to secure a satisfactory demodulation, as shown in FIGS. 14A and 14B, the AGC output signal (input to the demodulator) is settled down at the preamble (PREAM) portion (located in the head portion of the reception burst format) of the reception burst, so that the AGC output levels of the SYNC and DATA portions (follows the PREMA portion in the reception burst format) are put within a desired range of signal levels.

In a case where the fixed repetition pattern is used for the AGC preamble as mentioned, the radio signal having undergone a frequency selective fading channel improperly operates the AGC portion or circuit. This problem is remarkably revealed in particular in a case where a symbol rate is faster than a fading variation rate and a state of fading little varies within the preamble portion. The frequency selective fading will be described. The frequency selective fading occurs where a delay quantity of a delayed wave, reflected by a distant obstacle, e.g., mountain and building, is not negligible when comparing with the symbol period (FIG. 15).

A fading phenomenon producing a delay quantity of the delayed wave which is at least $1/10$ as large as the symbol period sometimes is categorized into the frequency selective fading. If no measure is taken for this fading, the preceding wave interferes with the delayed wave, thereby causing a misjudgment of the received signal (FIG. 16). A composite wave of the preceding wave and the delayed wave is depicted in terms of a frequency spectrum in in FIG. 17. The graph shows a great distortion of a waveform, which is representative of an intensity variation of a reception signal having undergone the frequency selective fading channel with respect to frequency. In this sense, the fading of this type is called the "frequency selective fading". Thus, the frequency selective fading is more likely to occur with increase of the information rate, or the symbol rate.

In the wireless communication system of the type in which a simple repetition pattern is used for the AGC preamble pattern, when the signal is distorted by frequency selective fading channel, an average reception power of the preamble portion greatly varies depending on a relative phase of the preceding wave to the delayed wave and vice versa. FIG. 18 is a vector diagram showing relative phases of the preceding wave to the delayed wave, and the composite waves of those waves at the relative phases. In the figure, times 1 to 3 indicate consecutive three symbols. In case where the fixed repetition pattern is used for the preamble, a relative phase of the preceding wave to the delayed wave is invariable, and therefore, if the fading rate is sufficiently lower than the data transmission rate, the fixed relative phase will be maintained during the preamble reception. The diagram of FIG. 18 shows three cases: a first case where the preceding wave and the delayed wave cancel out (vector diagrams (1), (2) and (3)); a second case where those waves a little interact with each other (vector diagrams (4), (5) and (6)); and a third case where those waves additively act (vector diagrams (7), (8) and (9)). The relative phase of preceding wave to the delayed wave varies depending on a delay quantity of the delayed wave. Therefore, the relative phase randomly varies with the movement of the mobile station MS. And the average reception power varies with time.

When a random pattern is received (in this case, the data portion will take a substantially random pattern by scramble and the like), the relative phase of the preceding wave to the delayed wave varies also within the burst. Therefore, the preceding wave and the delayed wave additively and subtractively act within the same burst, and the average reception power is uniform over the entire range of the burst, as shown in FIG. 19.

In the wireless communication system where the AGC output signal is settled down at the preamble portion and its intensity level is kept substantially constant in the subsequent data portion, the reception power difference between the preamble portion and the data portion is great, entailing a poor modulation. The operation of the AGC circuit in connection with this is shown in FIGS. 20A and 20B. In this case, viz., the large reception power difference is present between the preceding wave and the subsequent delayed wave (including the SYNC portion), if the AGC output signal is settled down at the preamble portion ((1) in FIGS. 20A and 20B), there is produced an improper output level at the in the data portion. The AGC output signal must be settled down again ((3) in FIGS. 20A and 20B) till the AGC output signal is approximate to the reference value. Thence, the demodulator continues its improper demodulation of the data ((2) in FIGS. 20A and 20B) till the AGC output signal is settled down again.

SUMMARY OF THE INVENTION

The present invention has been made to solve the above problems, and has an object to provide a data transmission system, and a data transmitter and a data receiver, which can secure a satisfactory level control (AGC) and a proper level detection under the frequency selective fading environment, whereby a good communication is secured.

To achieve the above object, according to the invention, there is provided a data transmission system in which a transmitter side adds control data to transmission data, and modulates the resultant signal by a predetermined modulation method, and sends the result in a wireless manner, and a receiver side detects a reception power intensity by use of the control data contained in the transmitted signal, the improvement being characterized in that a random pattern is used for a reception-power detecting portion for detecting a reception power intensity, which is contained in the control data.

In the data transmission system, the reception-power detecting portion is located preceding to the transmission data, and in the receiver side, a reception power intensity of the reception-power detecting portion is detected, and the reception power intensity of the subsequent transmission data portion is adjusted.

In the data transmission system, the reception-power detecting portion is located preceding to the transmission data, and in the receiver side, an antenna selection diversity is realized which detects a reception power intensity of the reception-power detecting portion, and selects a receiving antenna for the subsequent transmission data portion.

In the data transmission system, the reception-power detecting portion is located preceding to the transmission data, and in the receiver side, a reception power intensity is detected during the reception-power detecting portion, and a hand-over function is realized which selects a transmitter station.

In the data transmission system, the reception-power detecting portion is located preceding to the transmission data, and in the receiver side, a reception power intensity is detected during the reception-power detecting portion, and a hand-over function is realized which selects a transmitter station of the subsequent transmission data portion.

In the data transmission system, the random pattern is an M-sequence data pattern.

In the data transmission system, the random pattern contains an M-sequence data pattern of 7 bits or longer.

In the data transmission system, the random pattern is a random pattern of which one period is longer than a distance corresponding to the number of bits representative of the maximum delay quantity of a delayed wave that is prescribed in the channel model for the wireless communication system.

In the data transmission system, when the transmission data is transmitted, the control data of one burst is added every one or a plural number of transmission data.

The invention provides a data transmitter in use with a data transmission system in which a transmitter side adds control data to transmission data, and modulates the resultant signal by a predetermined modulation method, and sends the result in a wireless manner, and a receiver side detects a reception power intensity by use of the control data contained in the transmitted signal, the data transmitter comprises random pattern adding means for adding a random pattern to a reception-power detecting portion for detecting a reception power intensity, which is contained in the control data.

In the data transmission system, the random pattern added by the random pattern adding means is an M-sequence data pattern.

In the data transmission system, the random pattern added by the random pattern adding means contains an M-sequence data pattern of 7 bits or longer.

In the data transmission system, the random pattern added by the random pattern adding means is a random pattern of which one period is longer than a distance corresponding to the number of bits representative of the maximum delay quantity of a delayed wave that is prescribed in the channel model for the wireless communication system.

In the data transmission system, the random pattern adding means operates such that when the transmission data is transmitted, the control data of one burst is added every one or a plural number of transmission data.

The invention further provides a data receiver in use with a data transmission system in which a transmitter side adds control data to transmission data, and modulates the resultant signal by a predetermined modulation method, and sends the result in a wireless manner, and a receiver side detects a reception power intensity by use of the control data contained in the transmitted signal, the data receiver comprises a reception-power intensity adjusting means for detecting a reception power intensity in the reception-power detecting portion and adjusting a reception power intensity of the subsequent transmission data portion when a random pattern is added to a reception-power detecting portion for detecting a reception power intensity, which is contained in the control data, and the reception-power detecting portion is located preceding to the transmission data.

The present invention also provides a data receiver in use with a data transmission system in which a transmitter side adds control data to transmission data, and modulates the resultant signal by a predetermined modulation method, and sends the result in a wireless manner, and a receiver side detects a reception power intensity by use of the control data contained in the transmitted signal, the data receiver comprises antenna select diversity means for detecting a reception power intensity in the reception-power detecting portion and for selecting a receiving antenna, when a random pattern is added to a reception-power detecting portion for detecting a reception power intensity, which is contained in the control data, and the reception-power detecting portion is located preceding to the transmission data.

Additionally, the invention provides a data receiver in use with a data transmission system in which a transmitter side adds control data to transmission data, and modulates the resultant signal by a predetermined modulation method, and sends the result in a wireless manner, and a receiver side detects a reception power intensity by use of the control data contained in the transmitted signal, the data receiver comprises antenna select diversity means for detecting a reception power intensity in the reception-power detecting portion and for selecting a receiving antenna for the subsequent transmission data portion, when a random pattern is added to a reception-power detecting portion for detecting a reception power intensity, which is contained in the control data, and the reception-power detecting portion is located preceding to the transmission data.

Further, the invention provides a data receiver in use with a data transmission system in which a transmitter side adds control data to transmission data, and modulates the resultant signal by a predetermined modulation method, and sends the result in a wireless manner, and a receiver side detects a reception power intensity by use of the control data contained in the transmitted signal, the data receiver comprises handover control means for detecting a reception power intensity in the reception-power detecting portion and for selecting a transmitter station for the subsequent transmission data portion, when a random pattern is added to a reception-power detecting portion for detecting a reception power intensity, which is contained in the control data, and the reception-power detecting portion is located preceding to the transmission data.

BRIEF DESCRIPTION OF THE DRAWINGS

FIG. 5 is a block diagram showing an arrangement of an AGC portion of the receiver in the second embodiment;

FIG. 6 is a block diagram showing a receiver of a wireless communication system, which is an embodiment 3 of the present invention;

DETAILED DESCRIPTION OF THE PREFERRED EMBODIMENTS

The preferred embodiments of the present invention will be described with reference to the accompanying drawings.

Embodiment 1

Figure 1:
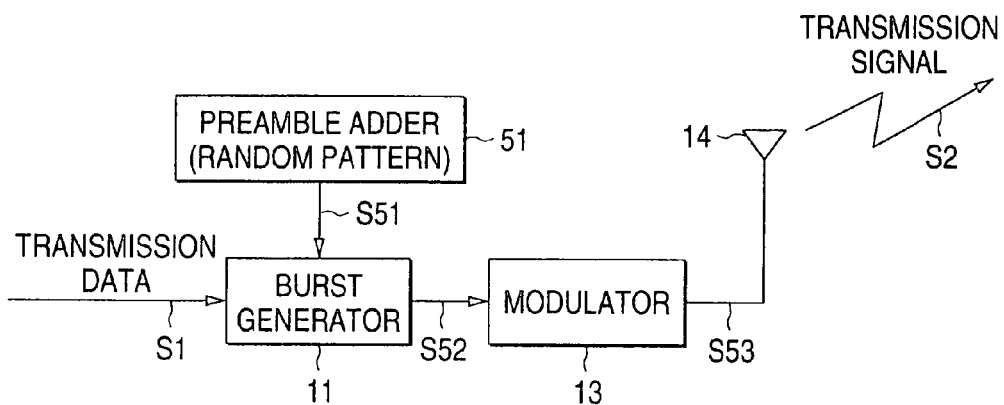
FIG. 1 is a block diagram showing a transmitter in a wireless communication system which is an embodiment 1 of the present invention.
Figure 8:
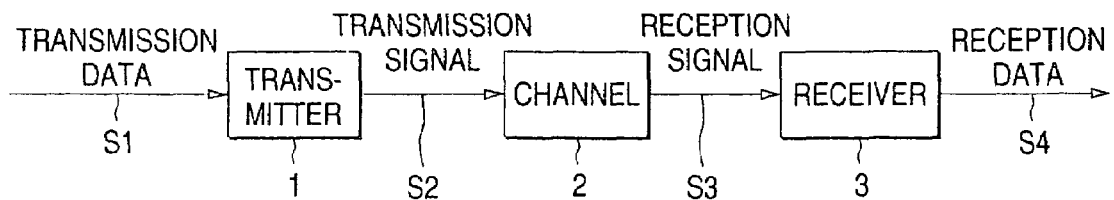
FIG. 8 shows in block form an overall wireless communication system.
Figure 9:
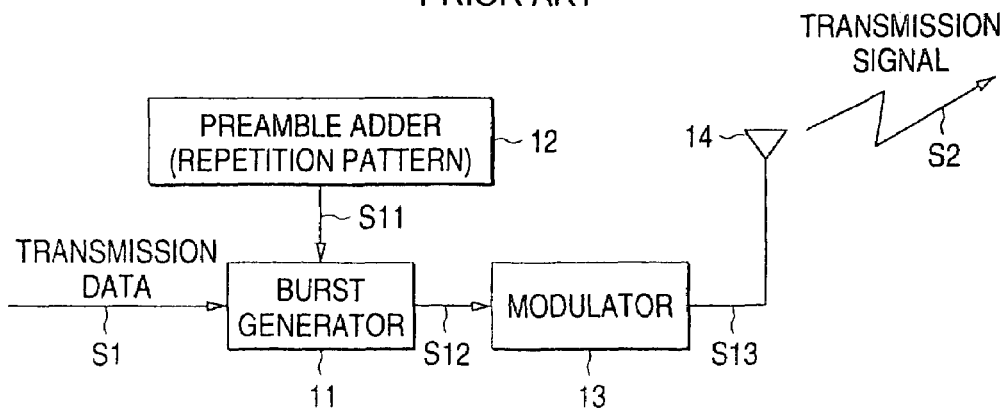
FIG. 9 shows in block form a conventional transmitter in the wireless communication system.
Figure 10:
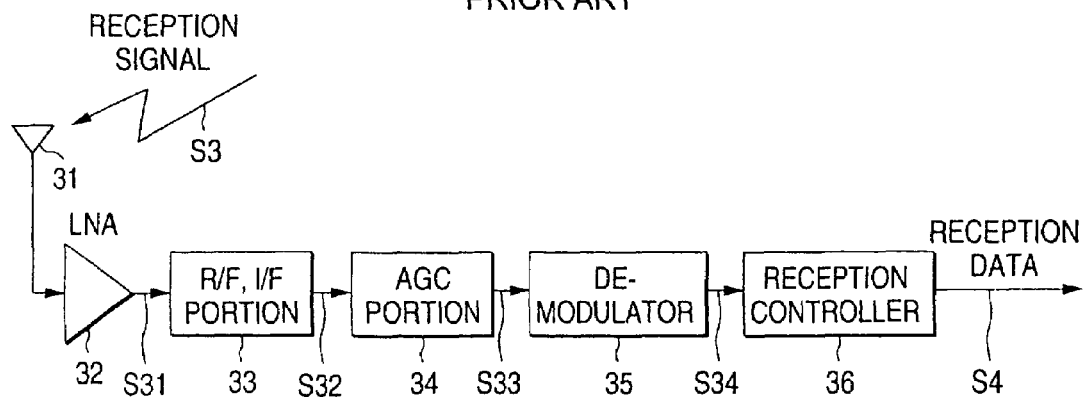
FIG. 10 shows in block form a conventional receiver in the wireless communication system.

FIG. 1 is a block diagram showing a transmitter in a wireless communication system which is an embodiment 1 of the present invention. Like reference numerals are used for designating like or equivalent portions in FIG. 9 showing the prior transmitter already described. In the figure, reference numeral 11 is a burst generator; 13 is a modulator; 14 is an antenna; and 51 is a preamble adder. The burst generator 11 receives transmission data S1 and an information signal S11 from the preamble adder 51, and generates a transmission burst S52 by use of those signals. The modulator 13 modulates the transmission burst S52 derived from the burst generator 11. The antenna 14 emits a modulated signal S53. The arrangements of the wireless communication system and the receiver are substantially the same as those of the prior ones described in connection with FIGS. 8 and 10. In the embodiment 1, the channel 2 (FIG. 8) is a channel suffering from the frequency selective fading channel.

Figure 2A:
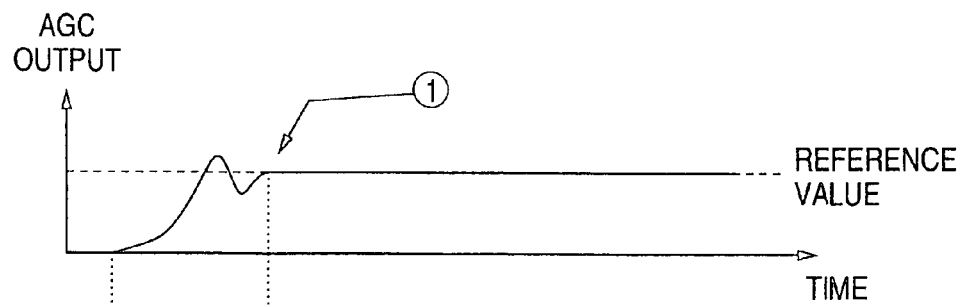
FIGS. 2A and 2B are explanatory diagrams useful in explaining the structure of a transmission burst generated in the transmitter.
Figure 2B:
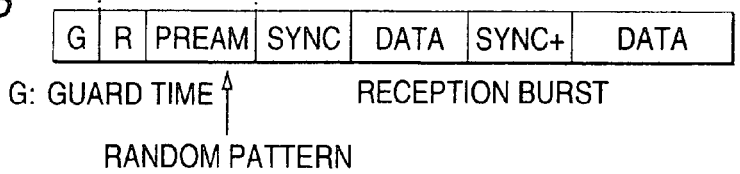

The operation of the transmitter of the embodiment 1 will be described. The burst generator 11 generates a transmission burst S52 by adding bits of the ramp (R) and the sync word (SYNC) and an AGC preamble (random pattern) to data (DATA) to be transmitted (FIGS. 2A and 2B). The transmission burst 552 is modified by the modulator 13, and emitted from the antenna 14, in the form of a transmitting radio signal S2. The transmitting radio signal S2 undergoes a frequency selective fading channel 2, and reaches the antenna 31 of the receiver. In the receiver, the received signal is amplified by the LNA 32, and converted into a low-frequency signal S32 by the RF/IF portion 33. The output signal of the RF/IF portion 33 contains a great variation of signal level. The AGC portion 34 then removes signal level variation from the incoming signal, and applies its output signal to the demodulator 35. The reception controller 36 extracts the data portion from the burst of the demodulated signal, and outputs a reception data signal S4.

Figure 3:
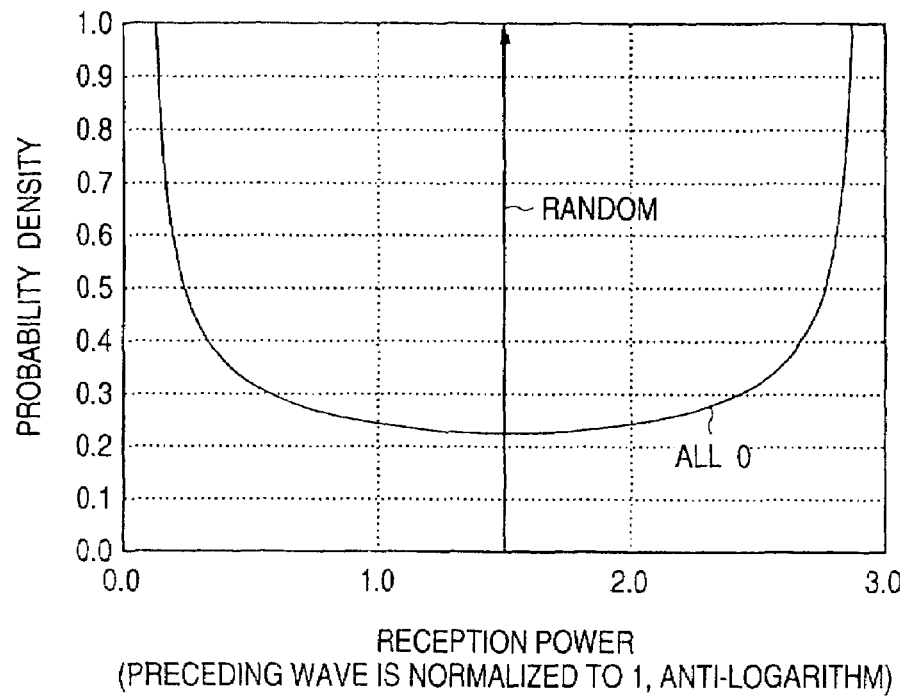
FIG. 3 is a graph showing a probability density distribution of reception power obtained when two QPSK modulated waves interfere with each other in random phase-differences.

A probability density distribution of reception power obtained when two QPSK modulated waves (preceding wave power=1 (normalized value) and delayed wave=0.5) interfere with each other in random phase-differences, is shown in terms of normalized anti-logarithm in FIG. 3. In the graph, an M-sequence is employed for a random pattern. As seen from the graph, the reception power of the random pattern is substantially constant, but the reception power of the ALLO (repetition pattern) greatly varies. Therefore, the former reception power will be incoincident with the latter one highly probably.

In the embodiment 1, it is noted that the random pattern is used for the preamble. Therefore, there is no chance that a great difference of reception power is produced between the preamble portion and the data portion in the burst. The AGC portion 34 settles down a signal level variation of the reception signal having undergone the frequency selective fading into a proper signal level ((1) in FIGS. 2A and 2B) in the preamble portion of the burst signal, whereby it adjusts the signal level of the subsequent data portion to the reference value or its near value.

The random pattern, which is added, as the preamble, in forming the burst by the preamble adder 51, is not limited to that of the M-sequence, but may take any other random pattern if the preamble pattern is not a repetition pattern of which one period is shorter than a distance corresponding to the number of bits representative of the maximum delay quantity of the delayed wave. In other words, any random pattern may be used if it causes the modulated signal of the preamble portion whose spectrum is not a line spectrum but a broad spectrum.

Embodiment 2

Figure 4:
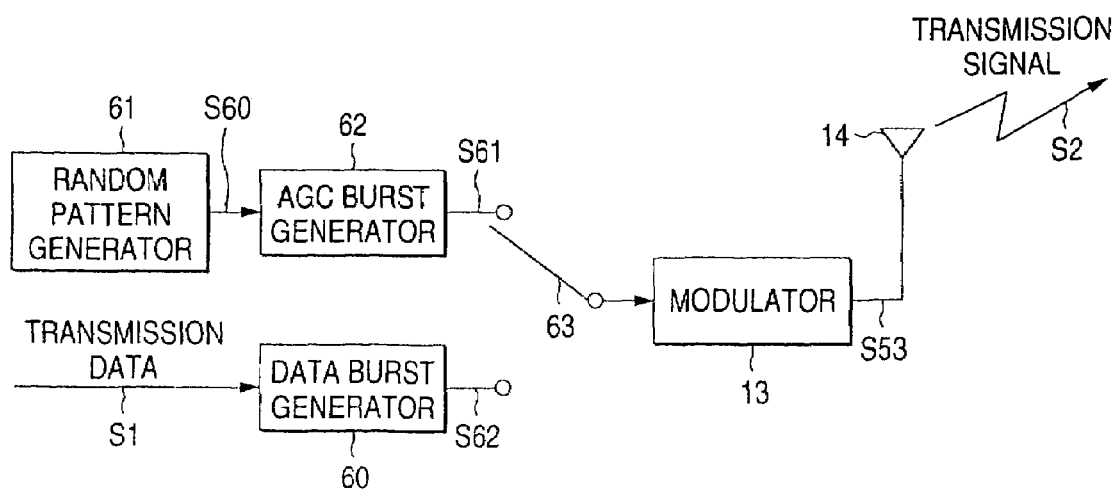
FIG. 4 is a block diagram showing a transmitter of a wireless communication system, which is an embodiment 2 of the present invention.
Figure 13:
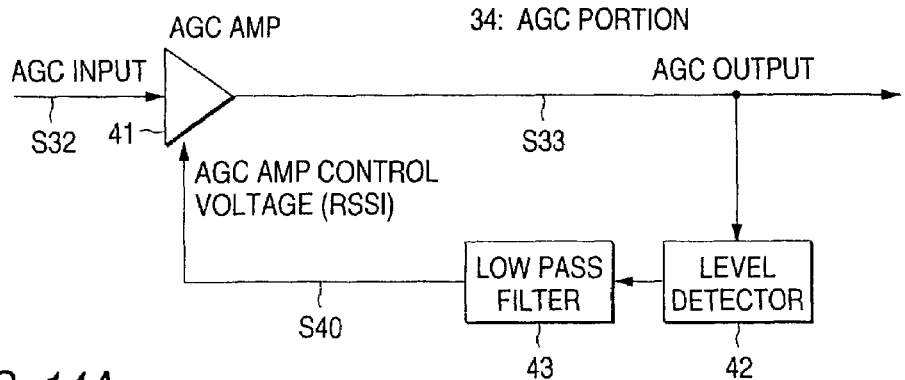
FIG. 13 is a block diagram showing an arrangement of the conventional AGC portion.
Figure 14A:
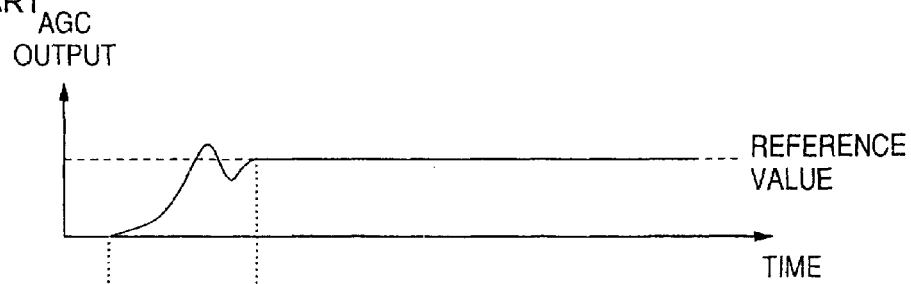
FIGS. 14A and 14B are diagrams useful in explaining an AGC processing procedure.
Figure 14B:
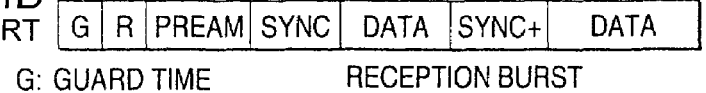
Figure 15:
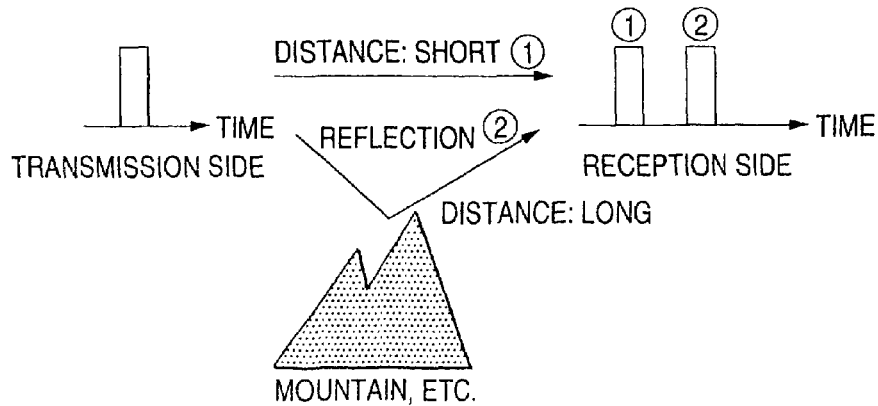
FIG. 15 is a diagram useful in explaining a frequency selective fading.
Figure 16:
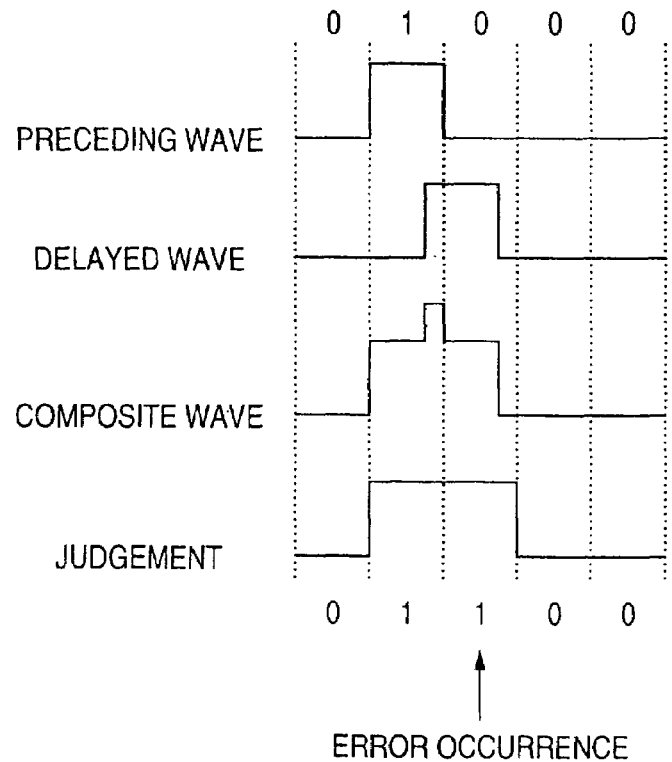
FIG. 16 is a set of waveforms for explaining the occurrence of an error when the radio signal undergoes a frequency selective fading.
Figure 17:
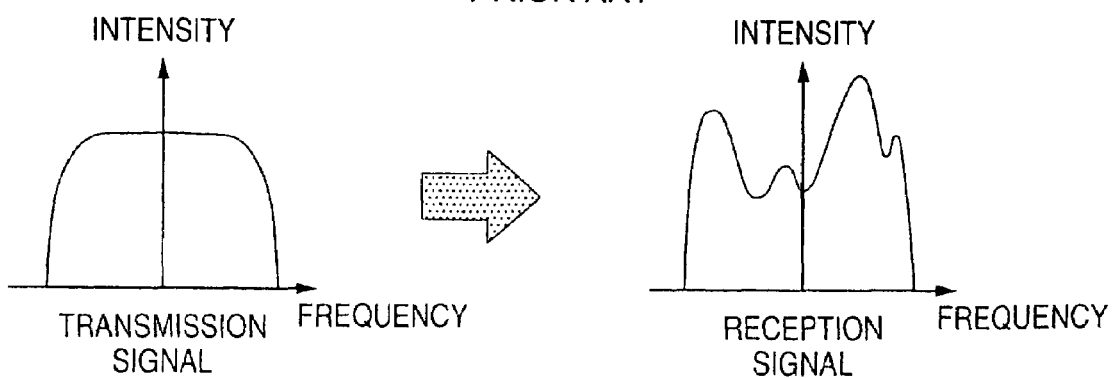
FIG. 17 is a diagram showing frequency spectra of a preceding wave and a delayed wave when the radio wave distorted by a frequency selective fading channel.
Figure 18:
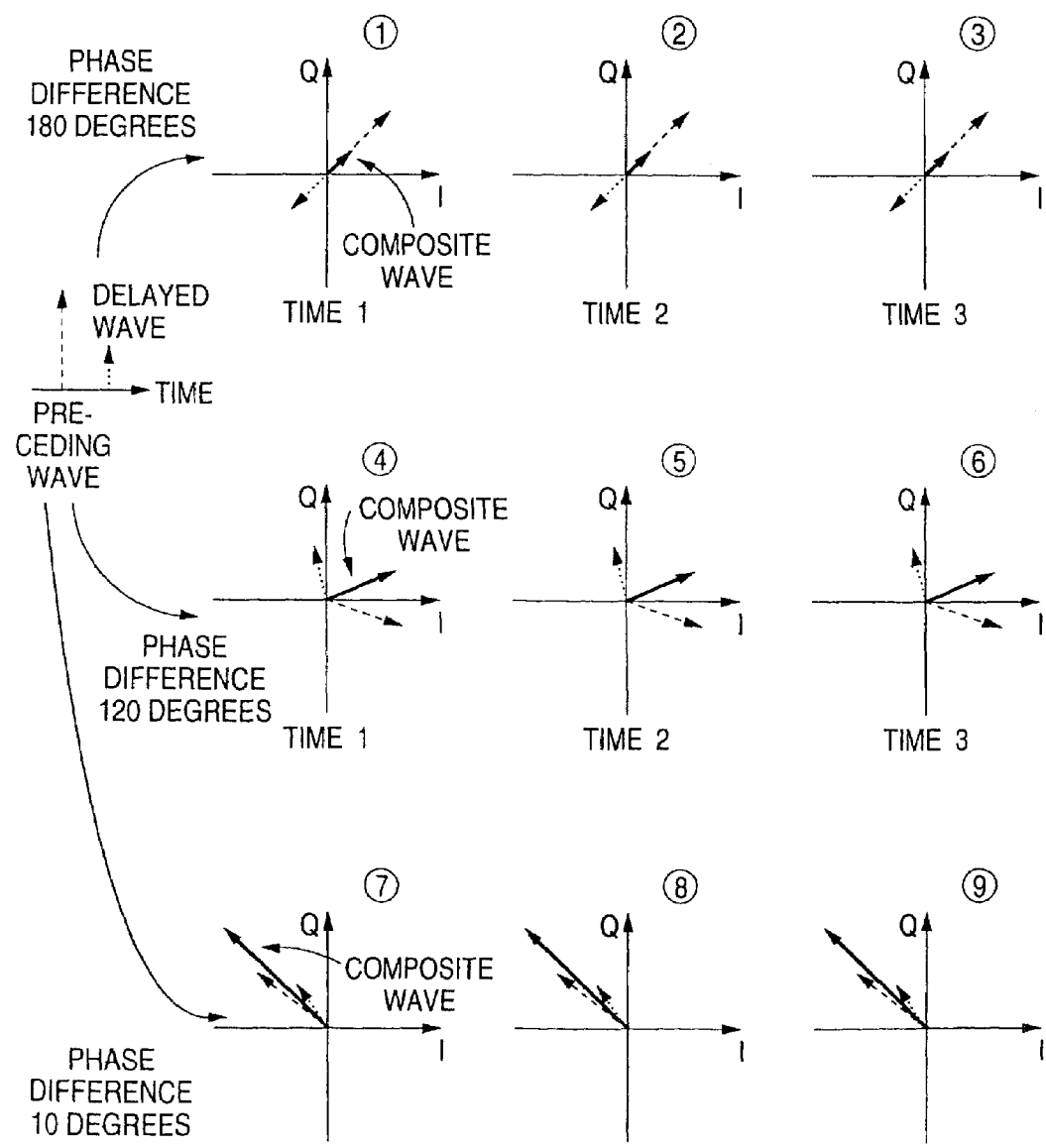
FIG. 18 is a vector diagram showing relative phases of the preceding wave to the delayed wave, and the composite waves of those waves at the relative phases.
Figure 19:
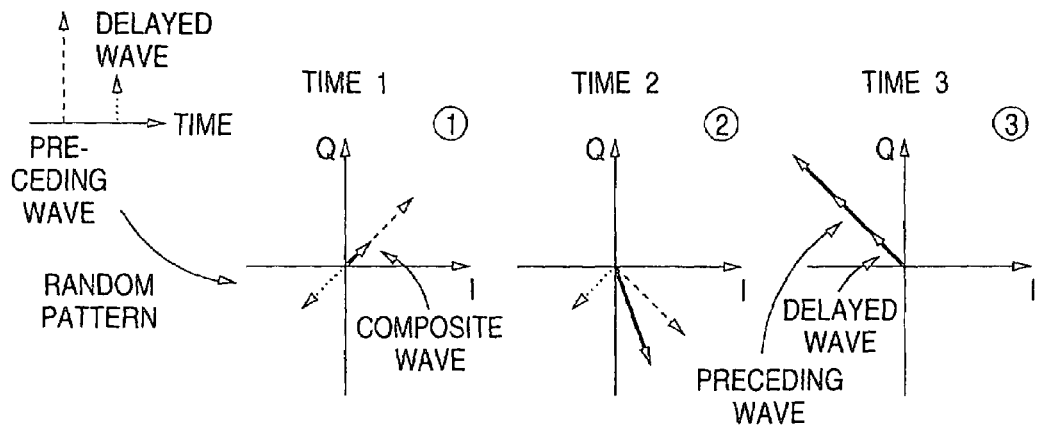
FIG. 19 is a vector diagram useful in explaining a case where the preceding wave and the delayed wave additively and subtractively act within the same burst.
Figure 20A:
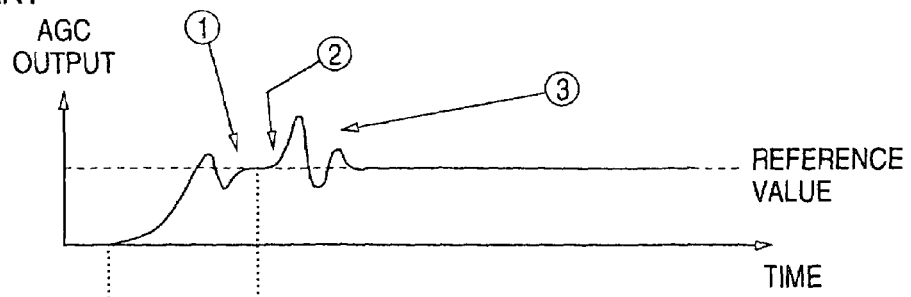
FIGS. 20A and 20B are diagrams showing a case where a reception power level difference is present between the preamble portion and the subsequent data portion in the burst.
Figure 20B:
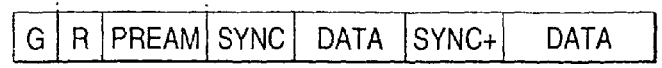

A transmitter of a wireless communication system, which is an embodiment 2 of the present invention, is shown in FIG. 4 which uses like reference numerals for designating like or equivalent portions in FIG. 1 showing the embodiment 1. An arrangement of an AGC portion of the receiver in the wireless communication system of the second embodiment is shown in FIG. 5 which uses like reference numerals for designating like or equivalent portions in FIG. 13 of the prior AGC portion. In FIG. 4, reference numeral 60 is a data burst generator; 61 is a random pattern generator; 62 is an AGC burst generator; and 63 is a burst-select switch. The data burst generator 60 generates a data burst signal S62. The random pattern generator 61 generates an AGC random pattern S60. The AGC burst generator 62 generates an AGC burst signal S61. The burst-select switch 63 selects a burst signal to be transmitted, an AGC burst signal S61 or a data burst signal S62. In FIG. 5, reference numeral 70 is a memory for storing an output signal S40 of the LPF 43 in the form of an AGC-amplifier control voltage S40A; and 71 is a switch to determine as to whether or not the output signal S40 of the LPF 43 is to be stored into the memory 70. The arrangements of the wireless communication system and the receiver, which are used for this embodiment, are substantially the same as those in FIGS. 8 and 10.

The operation of the transmitter of the second embodiment will be described. In the transmitter, the AGC burst generator 62 generates an AGC burst signal S61 by use of an AGC random pattern S60 output from the random pattern generator 61. Further, the data burst generator 60 generates a data burst signal S62 by use of the transmission data S1. The burst-select switch 63 selects one of those bust signals in accordance with a predetermined procedure, the modulator 13 modulates the selected burst signal, and the modulated signal is emitted from the antenna 14, in the form of a transmitting radio signal S2. The signal S2 experiences a frequency selective fading and enters the receiver 3. In the receiver, the received signal is processed for amplification and frequency-conversion into an AGC input signal S3.

During the reception of the AGC burst, the switch 71 is turned on in the AGC loop, and the AGC-amplification control voltages (RSSI) S40 and S40A control the AGC amplifier 41 so that the output signal of the amplifier has the reference value. In the reception of the data burst signal, the switch 71 is turned off, a value which was stored in the memory 70 when the AGC burst signal is received is used as the RSSI voltage S40A.

In the second embodiment 2, when the AGC burst signal and the data bust signal are received, if a variation in a state of the channel 2 is small, the RSSI S40 of the equal value may be used for the data burst receiving process, and hence the AGC amplifier produces an AGC output signal S33 at a proper level from the start of the burst during the data burst reception. Therefore, the subsequent signal processings by the demodulator 35 and the reception controller 36 will be performed normally, whereby good data reception is effected on the basis of the proper demodulation. Also in the data burst reception, the value of the RSSI 40A may be corrected by turning on the switch 71.

Embodiment 3

FIG. 6 is a block diagram showing a receiver in a wireless communication system, which is an embodiment 3 of the present invention. In FIG. 6, like reference numerals are used for designating like or equivalent portions in FIG. 10. The receiver consists of two signal routes ranging from the antenna 31 to the level detectors. The circuit components in those signal routes are distinguished from each other by affixing letters A and B at the ends of reference numerals. In the figure, reference numerals 80A and 80B are level detectors; 81 is a selector; and 82 is a switch. The level detector 80A (80B) measure a reception power level and produces a reception level information signal S80A (S80B). The selector 81 receives the reception level information signals S80A and S80B, and selects the level information signal of better reception state among from those received signals. The switch 82 is driven in response to a control signal S81 from the selector 81. Signals S82A and S82B are output from the level detectors 80A and 80B. The arrangements of the wireless communication system and the transmitter, which are used for this embodiment, are substantially the same as those in FIGS. 8 and 1.

The operation of the embodiment 3 will be described. The antennae 31A and 31B receive a radio wave from the transmitter. The signals, received by those antennae, are amplified and frequency-converted, and input to the level detectors 80A and 80B. The level detectors 80A and 80B detects power levels of the signals S32A and S32B, and outputs the reception-level information signals S80A and S80B to the selector 81. The level detectors 80A and BOB may take any of various forms. In case where those are constructed with the AGC circuits, the RSSI signals are used as the reception-level information signals.

Figure 11:
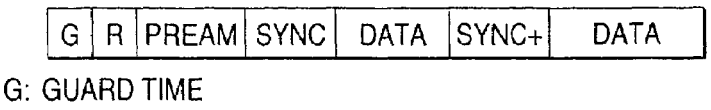
FIG. 11 is a diagram showing a burst format containing an AGC preamble added thereto.
Figure 12:
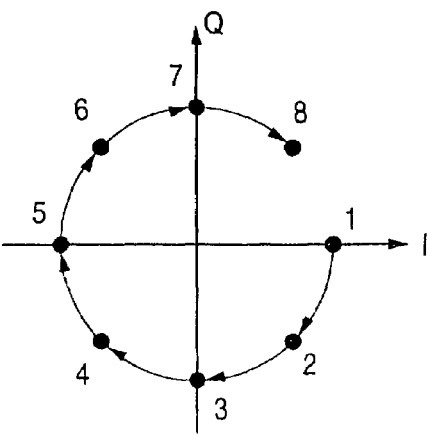
FIG. 12 is a diagram showing the phases of those symbols of the preamble.

The selector 81 compares the reception-level information signals S80A and S80B from the level detectors 80A and 80B, and outputs a control signal S81 as the result of the comparison to the switch 82. In turn, the switch 82 allows the signal, which is received by the antenna 31A or 31B and selected by the selector 81, to pass therethrough and go to the demodulator 35. When the burst format shown in FIG. 11 is used, the selector 81 is operated during the receiving of the AGC preamble to operate the switch 82. By so doing, a reception signal is more suitable for the receiving of the data portion, improving the receiving performance of the receiver. Also in the embodiment 3, it is essential to predict a reception power intensity during the processing of the preamble portion.

Embodiment 4

Figure 7:
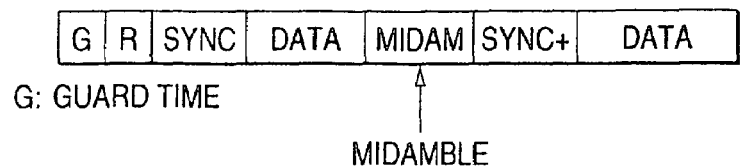
FIG. 7 is a diagram showing a burst format used in the embodiment 4.

FIG. 7 shows a burst format used in an embodiment 4 of the present invention. In a wireless communication system where the RSSI for the AGC is determined by use of reception power information of a burst signal received in the past, the AGC pattern may be located at the middle or the end of the burst format (midamble and postamble). The preamble, midamble and postamble may properly be combined.

Embodiment 5

In a mobile station which receives radio waves from a plural number of base stations, the present invention may be used for selecting a desired base station from among those base stations. Specifically, a reception level is detected by use of the AGC preamble of a random pattern or the AGC burst signal, and the best base station is determined by the detected reception level and sets up a related channel. This selection may be performed during the receiving through a specific channel.

What is claimed is:

1. A data transmitting method of a mobile wireless communication system in which a transmitter side adds a preamble to transmission data, and sends the resultant signal as a transmission signal, and the receiver side detects total reception power of the preamble contained in the transmission signal, the data transmitting method comprising:
 locating the preamble whose total reception power is detected in the receiver side preceding to the transmission data, wherein a random pattern is used for the preamble.

2. A data transmitting method of a transmitter in use with a mobile wireless communication system in which a transmitter side adds a preamble to transmission data, and sends the resultant signal as a transmission signal, and the receiver side detects total reception power of the preamble contained in the transmission signal, the data transmitting method comprising:
 locating the preamble whose total reception power is detected in the receiver side preceding to the transmission data, wherein a random pattern is used for the preamble.

3. A data receiving method of a receiver in use with a mobile wireless communication system in which a transmitter adds a preamble to transmission data, and sends the resultant signal as a transmission signal, and the receiver side detects total reception power of the preamble contained in the transmission signal, the data receiving method comprising:
 receiving the transmission signal in which the preamble whose total reception power is detected in the receiver side is located preceding to the transmission data in the transmitter side and a random pattern is used for the preamble; and
 detecting the total reception power of the preamble.

4. A mobile wireless communication system in which a transmitter side adds a preamble to transmission data, and sends the resultant signal as a transmission signal, and the receiver side detects total reception power of the preamble contained in the transmission signal, the mobile wireless communication system comprising:
 a preamble adder which locates the preamble whose total reception power is detected in the receiver side preceding to the transmission data, wherein a random pattern is used for the preamble.

5. A transmitter in use with a mobile wireless communication system in which a transmitter side adds a preamble to transmission data, and sends the resultant signal as a transmission signal, and the receiver side detects total reception power of the preamble contained in the transmission signal, the transmitter comprising:
 a preamble adder which locates the preamble whose total reception power is detected in the receiver side preceding to the transmission data, wherein a random pattern is used for the preamble.

6. A receiver in use with a mobile wireless communication system in which a transmitter side adds a preamble to transmission data, and sends the resultant signal as a transmission signal, and the receiver side detects total reception power of the preamble contained in the transmission signal, the receiver comprising:
 a reception unit which receives the transmission signal in which the preamble whose total reception power is detected in the receiver side is located preceding to the transmission data in the transmitter side and a random pattern is used for the preamble; and
 a detection unit which detects the total reception power of the preamble.

* * * * *